(12) United States Patent
Wan

(10) Patent No.: US 11,282,489 B2
(45) Date of Patent: Mar. 22, 2022

(54) METHOD AND CIRCUIT FOR CONTROLLING MULTI-USE HORN BY BUS

(71) Applicant: Yu Wan, Heilongjiang (CN)

(72) Inventor: Yu Wan, Heilongjiang (CN)

( * ) Notice: Subject to any disclaimer, the term of this patent is extended or adjusted under 35 U.S.C. 154(b) by 0 days.

(21) Appl. No.: 16/307,180

(22) PCT Filed: May 11, 2016

(86) PCT No.: PCT/CN2016/081687
§ 371 (c)(1),
(2) Date: Dec. 5, 2018

(87) PCT Pub. No.: WO2017/193301
PCT Pub. Date: Nov. 16, 2017

(65) Prior Publication Data
US 2019/0139526 A1 May 9, 2019

(51) Int. Cl.
*G10K 9/12* (2006.01)
*B60Q 5/00* (2006.01)
(Continued)

(52) U.S. Cl.
CPC ............... *G10K 9/122* (2013.01); *B60Q 5/00* (2013.01); *G10K 9/12* (2013.01); *G10K 9/13* (2013.01); *H03J 3/20* (2013.01)

(58) Field of Classification Search
CPC .. G01K 9/122; G01K 9/13; G01K 9/12; H03J 3/20; B60Q 5/00
See application file for complete search history.

(56) References Cited

U.S. PATENT DOCUMENTS

| | | | | |
|---|---|---|---|---|
| 2003/0184434 A1* | 10/2003 | Sague | ................... | B06B 1/0207 340/388.1 |
| 2015/0314726 A1* | 11/2015 | Massimo | ........... | G08B 13/2491 340/463 |
| 2017/0120812 A1* | 5/2017 | Sanjiv | ...................... | G10K 9/13 |

FOREIGN PATENT DOCUMENTS

| CN | 2741819 Y | 11/2005 |
|---|---|---|
| CN | 102700459 A | 10/2012 |

(Continued)

OTHER PUBLICATIONS

International Search Report (PCT/ISA/210) dated Jan. 26, 2017, by the Chinese Patent Office as the International Searching Authority for International Application No. PCT/CN2016/081687.

(Continued)

*Primary Examiner* — Rodney A Butler
(74) *Attorney, Agent, or Firm* — Buchanan Ingersoll & Rooney PC

(57) ABSTRACT

A method and circuit for controlling a multi-use horn by a bus are disclosed. The circuit comprises a bus signal receiving and transmitting unit used for receiving and transmitting a horn control instruction from a vehicle-mounted computer controller by the bus, a control unit used for generating a horn sounding signal adapting to a current scene according to the horn control instruction, and a horn sounding unit used for making sounds according to the horn sounding signal. By adoption of the method and circuit, the horn is connected to the vehicle-mounted computer controller by the bus and is controlled by the vehicle-mounted computer controller to make sounds, and thus, sound requirements for various horns for different uses on vehicles and engineering machines are met.

11 Claims, 2 Drawing Sheets

(51) Int. Cl.
    *H03J 3/20*     (2006.01)
    *G10K 9/13*     (2006.01)
    *G10K 9/122*     (2006.01)

(56) References Cited

FOREIGN PATENT DOCUMENTS

| | | | |
|---|---|---|---|
| CN | 102765349 A | 11/2012 | |
| CN | 204055552 U | 12/2014 | |
| CN | 204161358 U | 2/2015 | |
| WO | WO-9426555 A1 * | 11/1994 | ............... B60Q 1/54 |

OTHER PUBLICATIONS

Written Opinion (PCT/ISA/237) dated Jan. 26, 2017, by the Chinese Patent Office as the International Searching Authority for International Application No. PCT/CN2016/081687.

* cited by examiner

METHOD AND CIRCUIT FOR CONTROLLING MULTI-USE HORN BY BUS

BACKGROUND OF THE INVENTION

Technical Field

The present invention relates to horns for vehicles, in particular, to a method and circuit for controlling a multi-use horn by a bus.

Description of Related Art

Nowadays, many sounding devices are applied to various motor vehicles such as automobiles and forklifts as well as engineering machines such as excavators, cranes and bulldozers to ensure driving safety and convenience in use.

Horns for multiple uses, such as automotive whistle horns for ensuring driving safety, vehicle lock-up prompt horns for braking, alarm horns for vehicle anti-theft alarm during parking, back-up alarming horns, vehicle steering prompt horns, prompt horns for opening and closing trunks, anti-collision radar alarm horns, driving simulation horns for electric automobiles and other various multi-use warning and prompt horns, are applied to vehicles and have different requirements for the sound frequency, the spectrum, the sounding mode and the sound pressure level. These horns for multiple uses can facilitate vehicle usage by users to a certain extent. However, when the horns for multiple uses are integrated in one vehicle, the whole vehicle circuit will be too complex and the cost is increased.

BRIEF SUMMARY OF THE INVENTION

The objective of the present invention is to simplify the overall circuit and to reduce the cost of a vehicle integrating horns for multiple uses by providing a method and circuit for controlling a multi-use horn by a bus.

On one aspect, the embodiment of the present invention provides a circuit for controlling a multi-use horn by a bus. The circuit comprises:

a bus signal receiving and transmitting unit used for receiving and transmitting a horn control instruction from a vehicle-mounted computer controller by a bus;

a control unit used for generating a horn sounding signal adapting to a current scene according to the horn control instruction;

a horn sounding unit used for making sounds according to the horn sounding signal.

Furthermore, the circuit further comprises a power amplification unit used for carrying out power amplification on a target signal decoded from the horn sounding signal.

The horn sounding unit is also used for making sounds according to the power-amplified target signal decoded from the horn sounding signal.

Furthermore, the circuit further comprises a power supply unit used for providing a stabilized voltage supply for the circuit.

Furthermore, the bus is specifically a CAN bus or a LIN bus.

Furthermore, the control unit is specifically a single-chip microcomputer.

Furthermore, the horn sounding unit is specifically a piezoelectric horn or an electromagnetic horn.

Furthermore, the bus signal receiving and transmitting unit is composed of a bus interface chip, a bus, a first resistor R1, a second resistor R2 and a first capacitor.

On another aspect, the embodiment of the present invention provides a method for controlling a multi-use horn by a bus. The method comprises the following steps:

receiving and transmitting a horn control instruction from a vehicle-mounted computer controller by a bus;

generating a horn sounding signal adapting to a current scene according to the horn control instruction; and making sounds according to the horn sounding signal.

Furthermore, after the step of generating the horn sounding signal adapting to the current scene according to the horn control instruction, the method further comprises the step of carrying out power amplification on a target signal decoded from the horn sounding signal.

The step of making sounds according to the horn sounding instruction specifically comprises making sounds according to the power-amplified target signal decoded from the horn sounding signal.

The horn sounding signal is an automotive whistle horn sounding signal for ensuring driving safety, a vehicle lock-up prompt horn sounding signal for braking, an alarm horn sounding signal for vehicle anti-theft alarm during parking, a back-up alarming horn sounding signal, a vehicle steering prompt horn sounding signal, a prompt horn sounding signal for opening and closing a trunk, an anti-collision radar alarm horn sounding signal or a driving simulation horn sounding signal for an electric automobile.

Furthermore, the bus is specifically a CAN bus or a LIN bus.

According to the method and circuit for controlling the multi-use horn by the bus in the embodiment of the present invention, the horn is connected to the vehicle-mounted computer controller through the bus and is controlled by the vehicle-mounted computer controller to make sounds, so that sounding requirements for various horns for different uses on vehicles and engineering machines are met. The overall vehicle circuit simplified, and the vehicle cost is reduced.

DETAILED DESCRIPTION OF THE INVENTION

The technical solution in the embodiment of the present invention is clearly and completely described below with reference to the accompanying drawings. Obviously, this embodiment is only an illustrative one and does not show all the possible uses of the present invention. All other embodiments obtained by those ordinarily skilled in this field without creative work based on this illustrative embodiment should also fall within the protection scope of the present invention.

Figure 1:
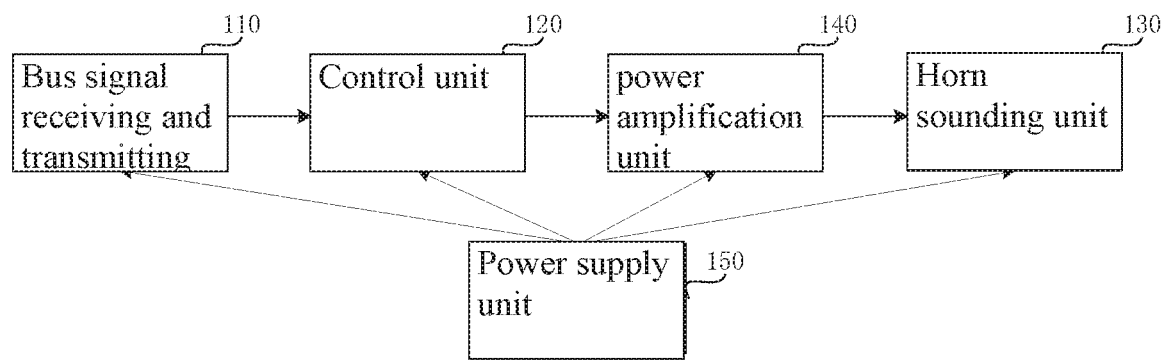
FIG. 1 is a block diagram of a circuit for controlling a multi-use horn by a bus in the embodiment of the present invention.

The solution provided by the embodiment of the present invention is expounded below without reference to FIG. 1. FIG. 1 is a block diagram of a circuit for controlling a multi-use horn by a bus in the embodiment of the present invention. The circuit for controlling the multi-use horn by the bus is disposed on a vehicle, is connected to a vehicle-mounted computer controller and is controlled by the vehicle-mounted computer controller. As shown in FIG. 1, the circuit for controlling the multi-use horn by the bus comprises the following units:

a bus signal receiving and transmitting unit 110 used for receiving and transmitting a horn control instruction from the vehicle-mounted computer controller by the bus, a control unit 120 used for generating a horn sounding signal adapting to a current scene according to the horn control instruction, and a horn sounding unit 130 used for making sounds according to the horn sounding signal.

Furthermore, the circuit further comprises a power amplification unit 140 used for carrying out power amplification on a target signal decoded from the horn sounding signal.

The horn sounding unit 130 is also used for making sounds according to the power-amplified target signal decoded from the horn sounding signal.

Furthermore, the circuit further comprises a power supply unit 150 used for providing a stabilized voltage supply for the circuit.

In this embodiment, the bus signal receiving and transmitting unit 110 is provided with a bus interface. The bus interface is connected to the vehicle-mounted computer controller and is used for receiving and transmitting the horn control instruction from the vehicle-mounted computer controller. The control unit 120 is used for decoding the horn control instruction sent from the vehicle-mounted computer controller through the bus and the bus signal receiving and transmitting unit 110 and generating horn sounding signals adapting to various scenes according to the horn control instruction such as a back-up horn sounding instruction and vehicle steering horn sounding instruction. It is understood that different sounding instructions are converted into signals with different frequencies, different spectrums and different duty cycles according to the different sounding requirements. The power amplification unit 150 carries out power amplification on a target signal decoded from the horn sounding signal and then drives the horn sounding unit 130 to make sounds. The power supply unit 150 provides a stabilized voltage supply for the whole circuit and prevents or retrains electro-magnetic compatibility (EMC) and disturbance from other vehicles.

Furthermore, in this embodiment, the bus is specifically, but not limited to, a controller area network (CAN) bus or a local interconnect network (LIN). The control unit 120 is specifically a single-chip microcomputer. The horn sounding unit 130 is specifically a piezoelectric horn or an electro-magnetic horn.

Figure 2:
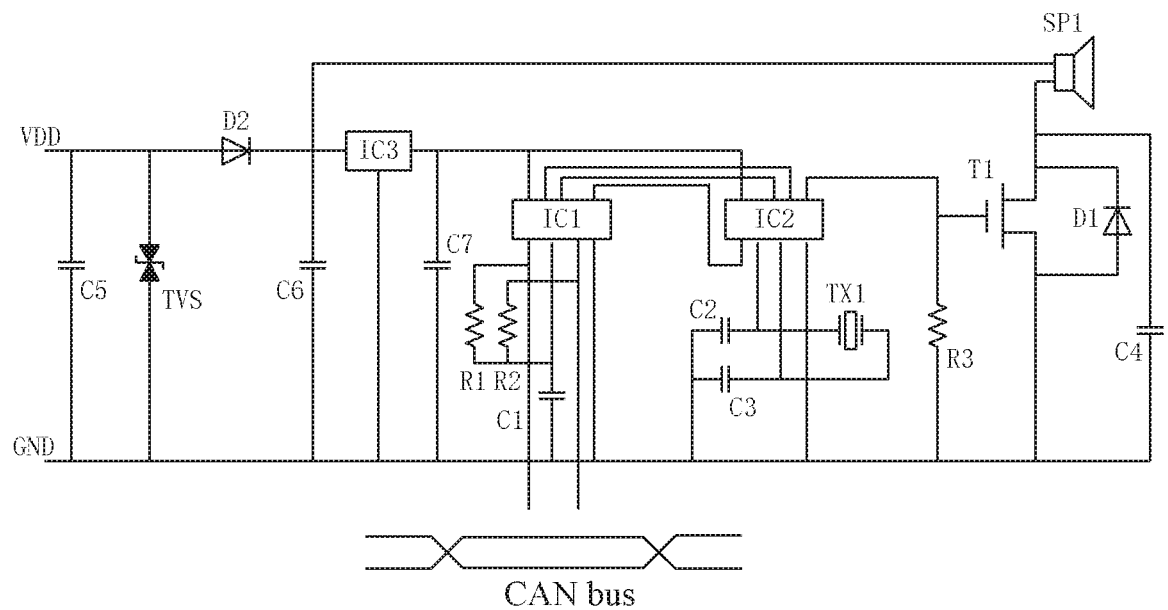
FIG. 2 is a circuit diagram of the circuit for controlling the multi-use horn by the bus in the embodiment of the present invention.
Figure 3:
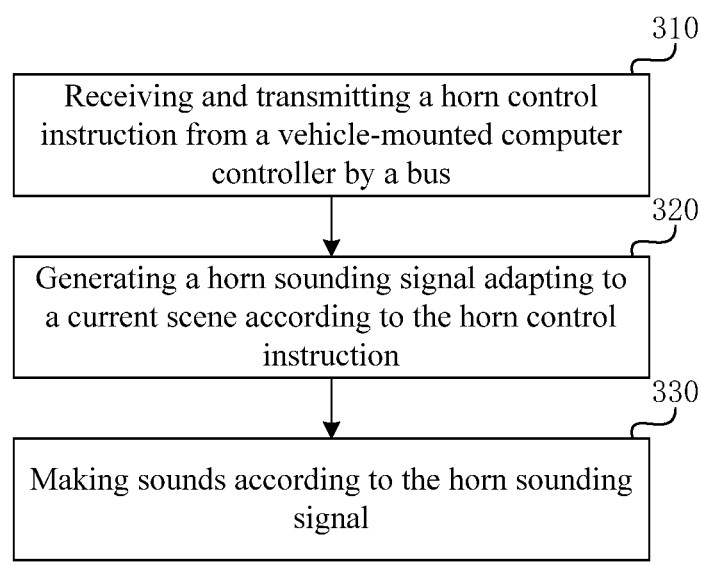
FIG. 3 is a flow diagram of a method for controlling a multi-use horn by a bus in the embodiment of the present invention.

The circuit for controlling the multi-use horn by the bus is explained and expounded below with reference to FIG. 2. FIG. 2 is a circuit diagram of the circuit for controlling the multi-use horn by the bus in the embodiment of the present invention. The circuit is able to fulfill the functions of the units mentioned above. As shown in FIG. 2, the circuit comprises the signal receiving and transmitting unit 110, the control unit 120, the horn sounding unit 130, the power amplification unit 140 and the power supply unit 150.

Sub-circuits of the units are expounded in detail below.

The bus signal receiving and transmitting unit 110 is composed of a bus interface chip IC1, a first resistor R1, a second resistor R2 and a first capacitor C1, wherein the bus interface chip IC1 is connected between VDD and the ground and is connected to the bus, the first resistor R1 has an end connected to the bus and an end connected to the first capacitor C1, the second resistor R2 has an end connected to the bus and an end connected to the first capacitor C1, and the first capacitor C1 has an end connected to the bus interface chip IC1 and an end connected to the ground.

The bus signal receiving and transmitting unit 110 is connected to a vehicle-mounted computer by bus and is used for receiving and transmitting a horn control instruction from the vehicle-mounted computer.

The control unit 120 is composed of a single-chip microcomputer IC2, a second capacitor C2, a third capacitor C3 and a crystal oscillator TX1, wherein the single-chip microcomputer IC2 is connected to the bus interface chip IC1 and is connected between VDD and the ground, the second capacitor C2 has an end connected to the single-chip microcomputer IC2 and one end of the crystal oscillator TX1 and an end connected to the ground, and the third capacitor C3 has an end connected to the single-chip microcomputer IC2 and the other end of the crystal oscillator TX1 and an end connected to the ground.

The horn sounding unit 130 comprises a horn SP1, wherein the horn SP1 is connected between VDD and the power amplification unit 140.

The power amplification unit 140 is composed of a third resistor R3, a field effect transistor T1, a first diode D1 and a fourth capacitor C4, wherein a gate of the field effect transistor is connected to the single-chip microcomputer IC2, the field effect transistor T1 is connected to the ground through the third resistor R3, and a source of the field effect transistor T1 is connected to the ground a parallel circuit formed by the first diode D1 and the fourth transistor C4 is connected between a drain and the source of the field effect transistor T1; a positive electrode of the first diode is connected to the source of the field effect transistor T1; an absorber protective circuit is formed by the field effect transistor T1, the first diode D1 and the fourth capacitor C4; and the drain of the field effect transistor T1 is connected to a negative electrode of the first diode D1 and the horn sounding unit 130.

Those ordinarily skilled in this field would appreciate that the power amplification circuit can be implemented by an electronic component such as an insulated gate bipolar transistor (IGBT), a transistor or a field effect transistor.

The horn sounding instruction output by the single-chip microcomputer IC2 is applied to the horn to drive the horn to make sounds after being amplified by the field effect transistor T1.

The power supply unit 150 is composed of a fifth capacitor C5, a sixth capacitor C6, a seventh capacitor C7, a transient voltage suppressor (TVS), a power supply anti-reverse connection diode D2 and a voltage stabilizer IC3, wherein the fifth capacitor C5, the sixth capacitor C6 and the seventh capacitor C7 are used for EMC protection; the fifth capacitor C5, the sixth capacitor C6, the seventh capacitor C7 and the TVS are connected in parallel and are connected between VDD and the ground; the power supply anti-reverse connection diode D2 is connected between the TVS and the sixth capacitor C6 and has a positive electrode connected to the TVS and a negative electrode connected to the sixth capacitor C6, and the voltage stabilizer IC3 has a first terminal connected to the negative electrode of the power supply anti-reverse connection diode D2, a second terminal connected to the seventh capacitor C7 and a third terminal connected to the ground.

The power supply unit 150 is connected to the bus signal receiving and transmitting unit 110, the control unit 120, the horn sounding unit 130 and the power amplification unit 140.

According to the circuit for controlling the multi-use horn by the bus in this embodiment of the present invention, the multi-use horn is connected to the vehicle-mounted computer controller through the bus and is controlled by the vehicle-mounted computer controller to make sounds, so that sounding requirements for various horns for different uses on vehicles and engineering machines are met. The circuit of a vehicle integrating horns for multiple uses is simplified, and the cost of the vehicle is reduced.

Correspondingly, the embodiment of the present invention further provides a method for controlling a multi-use horn by a bus. The method is implemented through the circuit mentioned above and specifically comprises the following steps:

Step 310, a horn control instruction from a vehicle-mounted computer controller is received and transmitted by a bus.

Particularly, in this embodiment, the bus is specifically, but not limited to, a CAN bus or a LIN bus, and the vehicle-mounted computer controller generates the horn control instruction used for controlling a horn in a vehicle to make sounds meeting current requirements of users and according to different requirements of the users.

The vehicle-mounted computer controller transmits the horn control instruction via the bus to the circuit for controlling the multi-use horn by the bus.

Step 320, a horn sounding signal adapting to a current scene is generated according to the horn control instruction.

Particularly, the circuit for controlling the multi-use horn by the bus generates the horn sounding signal adapting to the current scene according to the horn control instruction. The implementation process is detailed above and thus will no longer be repeated herein.

Furthermore, after the horn sounding signal is generated, power amplification is carried out on a target signal decoded from the horn sounding signal to drive the horn to make sounds.

In this embodiment, horn sounding signals, such as automotive whistle horn sounding signals for ensuring driving safety, vehicle lock-up prompt horn sounding signals for braking, alarm horn sounding signals for vehicle anti-theft alarm during parking, back-up alarm horn sounding signals, vehicle steering prompt horn sounding signals, prompt horn sounding signals for opening and closing trunks, anti-collision radar alarm horn sounding signals, driving simulation horn sounding signals for electric automobiles and other various multi-use warning and prompt horn sounding signals, adapting to different scenes are generated according to the horn control instruction. It is understood that different sounding instructions are converted into signals with different frequencies, different spectrums and different duty cycles according to different sounding requirements.

Step 330, the horn makes sounds according to the horn sounding signal.

Particularly, the horn is driven by the circuit for controlling the multi-use horn by the bus to make sounds according to the horn sounding signal.

According to the method for controlling the multi-use horn by the bus in this embodiment of the present invention, the multi-use horn is connected to the vehicle-mounted computer controller through the bus and is controlled by the vehicle-mounted computer controller to make sounds, so that sounding requirements for various horns for different uses on vehicles and engineering machines are met. The circuit of a vehicle integrating horns for multiple uses is simplified, and the cost of the vehicle is reduced.

The objectives, technical solutions and beneficial effects of the present invention are further expounded above with the above specific embodiment. It should be appreciated that the above embodiment is only a specific one and is not intended to limit the protection scope of the present invention. Any modifications, equivalent substitutes and improvements based on the spirit and principle of the present invention should also fall within the protection scope of the present invention.

What is claimed is:

1. A circuit for a vehicle that requires a plurality of horns generating a plurality of different horn soundings with regard to frequencies, spectrums and/or duty cycles for responding to a respective plurality of different scenes, the vehicle including a vehicle mounted-computer controller for generating a plurality of horn control instructions, each of the horn control instructions responding to a unique one of the plurality of different scenes, and transmitting the horn control instructions to a bus that extends from the vehicle-mounted computer controller to respective locations in the vehicle where the plurality of horns are located; said circuit comprising:
a first microcomputer configured as a bus signal receiving and transmitting unit connected to the bus, for receiving from the bus one of the plurality of horn control instructions from the vehicle-mounted computer controller and for transmitting the received one of the plurality of horn control instructions; wherein said plurality of horn control instructions correspond respectively to the plurality of horn soundings, each of which corresponds to a respective one of the plurality of scenes; said one of a plurality of horn control instructions is determined based on the respective one of the plurality of scenes;
a second microcomputer configured as a control unit configured to:
receive, from the first microcomputer, one of the plurality of horn control instructions and generate a horn sounding signal based on said one of the plurality of horn control instructions received from the first microcomputer, the horn sounding signal meets a requirement of the one of the plurality of scenes with regard to frequencies, spectrums and/or duty cycles, and
transmit the generated horn sounding signal to a respective one of the various horns used for making the multi-use horn sound according to the horn sounding signal.

2. The circuit according to claim 1, comprising:
a power amplification unit used for carrying out power amplification on a target signal decoded from the horn sounding signal;
the horn sounding unit is also used for making sounds according to the power-amplified target signal decoded from the horn sounding signal.

3. The circuit according to claim 2, comprising:
a power supply unit used for providing a stabilized voltage supply for the circuit.

4. The circuit according to claim 1, wherein the bus comprises a CAN bus or a LIN bus.

5. The circuit according to claim 1, wherein the control unit is a single-chip microcomputer.

6. The circuit according to claim 1, wherein the horn sounding unit is a piezoelectric horn or an electromagnetic horn.

7. The circuit according to claim 1, wherein the bus signal receiving and transmitting unit is composed of a bus interface chip, the bus, a first resistor R1, a second resistor R2 and a first capacitor.

8. A method for controlling a plurality of horns configured to generate different horn soundings with regard to frequencies, spectrums and/or duty cycles for responding to a respective plurality of different scenes, the vehicle including a vehicle mounted-computer controller for generating a plurality of horn control instructions, each of the horn control instructions responding to a unique one of the plurality of different scenes, and transmitting the horn control instructions to a bus that extends from the vehicle-mounted computer controller to respective locations in the vehicle where the plurality of horns are located; said method comprising the following steps:

receiving, from the bus, one of a plurality of horn control instructions from the vehicle-mounted computer controller and transmitting the received one of the plurality of horn control instructions by a bus signal receiving and transmitting unit configured as a first microcomputer; wherein said plurality of horn control instructions correspond respectively to the plurality of horn soundings, each of which corresponds to a respective one of the plurality of scenes; said one of a plurality of horn control instructions is determined based on one of the plurality of scenes;

a second microcomputer receiving from the first microcomputer, one of the horn control instructions;

the second microcomputer generating a horn sounding signal according to said one of a plurality of horn control instructions; the horn sounding signal meets a requirement of the one of the plurality of scenes with regard to frequencies, spectrums and/or duty cycles; and making the multi-use horn sound according to the horn sounding signal.

9. The method according to claim 8, wherein after the step of generating the horn sounding signal adapting to the current scene according to the horn control instruction, the method further comprises the step of carrying out power amplification on a target signal decoded from the horn sounding signal;

the step of making sounds according to the horn sounding instruction includes making sounds according to the power-amplified target signal decoded from the horn sounding signal;

wherein the horn sounding signal is an automotive whistle horn sounding signal for ensuring driving safety, a vehicle lock-up prompt horn sounding signal for braking, an alarm horn sounding signal for vehicle anti-theft alarm during parking, a back-up alarm horn sounding signal, a vehicle steering prompt horn sounding signal, a prompt horn sounding signal for opening and closing a trunk, an anti-collision radar alarm horn sounding signal or a driving simulation horn sounding signal for an electric automobile.

10. The method according to claim 8, wherein the bus is a CAN bus or a LIN bus.

11. A vehicle, the vehicle requiring different horn soundings with regard to frequencies, spectrums and/or duty cycles for responding to a respective plurality of different scenes; said vehicle comprising:

a vehicle-mounted computer controller and a bus connected to the vehicle-mounted computer; and at least one bus signal receiving and transmitting unit connected to the bus, for receiving one of a plurality of horn control instructions from the vehicle-mounted computer controller by the bus; and wherein said plurality of horn control instructions correspond respectively to the plurality of horn soundings, each of which corresponds to a respective one of the plurality of scenes; said one of a plurality of horn control instructions is determined based on one of the plurality of scenes; and a control unit used for generating a horn sounding signal based on said one of the plurality of horn control instructions, the horn sounding signal meets a requirement of the one of the plurality of scenes with regard to the frequencies, spectrums and/or duty cycles; and a horn sounding unit used for making the multi-use horn sound according to the horn sounding signal.

* * * * *